US011177187B2

(12) United States Patent
Chung et al.

(10) Patent No.: US 11,177,187 B2
(45) Date of Patent: *Nov. 16, 2021

(54) SENSOR PACKAGE AND MANUFACTURING METHOD THEREOF

(71) Applicant: Amkor Technology Singapore Holding Pte. Ltd., Singapore (SG)

(72) Inventors: Ji Young Chung, Seongnam-si (KR); Dong Joo Park, Incheon (KR); Jin Seong Kim, Goyang-si (KR); Jae Sung Park, Paju-si (KR); Se Hwan Hong, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/890,027

(22) Filed: Jun. 2, 2020

(65) Prior Publication Data

US 2020/0294875 A1    Sep. 17, 2020

Related U.S. Application Data

(63) Continuation of application No. 15/988,940, filed on May 24, 2018, now Pat. No. 10,672,676, which is a (Continued)

(30) Foreign Application Priority Data

Jun. 4, 2015    (KR) .................. 10-2015-0079157

(51) Int. Cl.
*H01L 23/15*    (2006.01)
*H01L 23/00*    (2006.01)
(Continued)

(52) U.S. Cl.
CPC .......... *H01L 23/15* (2013.01); *G06K 9/00053* (2013.01); *H01L 24/48* (2013.01);
(Continued)

(58) Field of Classification Search
CPC . H01L 2924/00015; H01L 2924/00014; H01L 2224/32225; H01L 2224/48227;
(Continued)

(56) References Cited

U.S. PATENT DOCUMENTS 9,728,476 B2    8/2017    Chung et al.
9,984,947 B2    5/2018    Chung et al.
(Continued)

FOREIGN PATENT DOCUMENTS

CN    104194271 A    12/2014
CN    104538379 A    4/2015
(Continued)

OTHER PUBLICATIONS

Search Report, Application No. CN201610391114.2, dated Jun. 23, 2020.
(Continued)

*Primary Examiner* — Manuchehr Rahmjoo
(74) *Attorney, Agent, or Firm* — McAndrews, Held & Malloy, Ltd.

(57) ABSTRACT

A fingerprint sensor device and a method of making a fingerprint sensor device. As non-limiting examples, various aspects of this disclosure provide various fingerprint sensor devices, and methods of manufacturing thereof, that comprise an interconnection structure, for example a bond wire, at least a portion of which extends into a dielectric layer utilized to mount a plate, and/or that comprise an interconnection structure that extends upward from the semiconductor die at a location that is laterally offset from the plate.

20 Claims, 5 Drawing Sheets

Related U.S. Application Data continuation of application No. 15/670,589, filed on Aug. 7, 2017, now Pat. No. 9,984,947, which is a continuation of application No. 15/144,565, filed on May 2, 2016, now Pat. No. 9,728,476.

(51) Int. Cl.
*G06K 9/00* (2006.01)
*H01L 23/498* (2006.01)
*H01L 23/495* (2006.01)
*H01L 23/31* (2006.01)
*H01L 21/56* (2006.01)

(52) U.S. Cl.
CPC ........ *H01L 21/561* (2013.01); *H01L 23/3121* (2013.01); *H01L 23/4952* (2013.01); *H01L 23/49805* (2013.01); *H01L 24/05* (2013.01); *H01L 24/29* (2013.01); *H01L 24/32* (2013.01); *H01L 24/73* (2013.01); *H01L 2224/02166* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/2919* (2013.01); *H01L 2224/32225* (2013.01); *H01L 2224/33181* (2013.01); *H01L 2224/48091* (2013.01); *H01L 2224/48105* (2013.01); *H01L 2224/48165* (2013.01); *H01L 2224/48227* (2013.01); *H01L 2224/48992* (2013.01); *H01L 2224/48997* (2013.01); *H01L 2224/73215* (2013.01); *H01L 2224/73265* (2013.01); *H01L 2224/8592* (2013.01); *H01L 2224/92247* (2013.01); *H01L 2224/97* (2013.01); *H01L 2924/00014* (2013.01); *H01L 2924/15313* (2013.01); *H01L 2924/181* (2013.01)

(58) Field of Classification Search
CPC ....... H01L 2224/73265; H01L 2224/97; H01L 2924/00012; H01L 2224/05624; H01L 2224/05639; H01L 2224/05644; H01L 2224/05647; H01L 2224/05655; H01L 2224/2919; H01L 2224/48091; H01L 2224/92247; H01L 2924/181; H01L 2224/45099; H01L 2224/83; H01L 2224/85; H01L 2924/00; H01L 21/561; H01L 2224/02166; H01L 2224/33181; H01L 2224/48105; H01L 2224/48165; H01L 2224/48992; H01L 2224/48997; H01L 2224/73215; H01L 2224/8592; H01L 23/15; H01L 23/3121; H01L 23/4952; H01L 23/49805; H01L 24/05; H01L 24/29; H01L 24/32; H01L 24/48; H01L 24/73; H01L 2924/15313; G06K 9/00053

See application file for complete search history.

(56) References Cited

U.S. PATENT DOCUMENTS

| | | |
|---|---|---|
| 2005/0174128 A1 | 8/2005 | Kim |
| 2010/0117224 A1* | 5/2010 | McElrea ........... H01L 27/14618 257/723 |
| 2016/0335470 A1 | 11/2016 | Park |
| 2016/0358007 A1 | 12/2016 | Chung et al. |
| 2017/0121520 A1 | 5/2017 | Tan et al. |
| 2017/0338163 A1 | 11/2017 | Chung et al. |

FOREIGN PATENT DOCUMENTS

| | | |
|---|---|---|
| CN | 205944070 U | 2/2017 |
| JP | 4702586 B2 | 6/2011 |
| KR | 10-2009-0081037 | 7/2009 |
| KR | 10-2010-0069004 | 6/2010 |
| KR | 10-2015-0060098 A | 6/2015 |

OTHER PUBLICATIONS

Korean Office Action dated Mar. 28, 2017 for Korean Patent Application No. 10-2015-0079157.

* cited by examiner

SENSOR PACKAGE AND MANUFACTURING METHOD THEREOF

CROSS-REFERENCE TO RELATED APPLICATIONS/INCORPORATION BY REFERENCE

The present application is a continuation of U.S. application Ser. No. 15/988,940, filed on May 24, 2018, and titled "SENSOR PACKAGE AND MANUFACTURING METHOD THEREOF," expected to issue as U.S. Pat. No. 10,672,676; which is a continuation of U.S. application Ser. No. 15/670,589, filed on Aug. 17, 2017, and titled "FINGERPRINT SENSOR AND MANUFACTURING METHOD THEREOF," now U.S. Pat. No. 9,984,947; which is a continuation of U.S. application Ser. No. 15/144,565, filed on May 2, 2016, now U.S. Pat. No. 9,728,476 on Aug. 8, 2017, titled "FINGERPRINT SENSOR AND MANUFACTURING METHOD THEREOF"; which makes reference to, claims priority to, and claims the benefit of Korean Patent Application No. 10-2015-0079157, filed on Jun. 4, 2015, in the Korean Intellectual Property Office and titled "PACKAGE OF FINGERPRINT SENSOR," the contents of which are hereby incorporated herein by reference in their entirety.

BACKGROUND

Present semiconductor packages and methods for forming sensor devices (e.g., fingerprint sensor devices) are inadequate, for example resulting in inadequate sensing accuracy and/or device reliability, manufacturability issues, devices that are thicker than necessary, devices that are difficult and/or costly to incorporate into other products, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
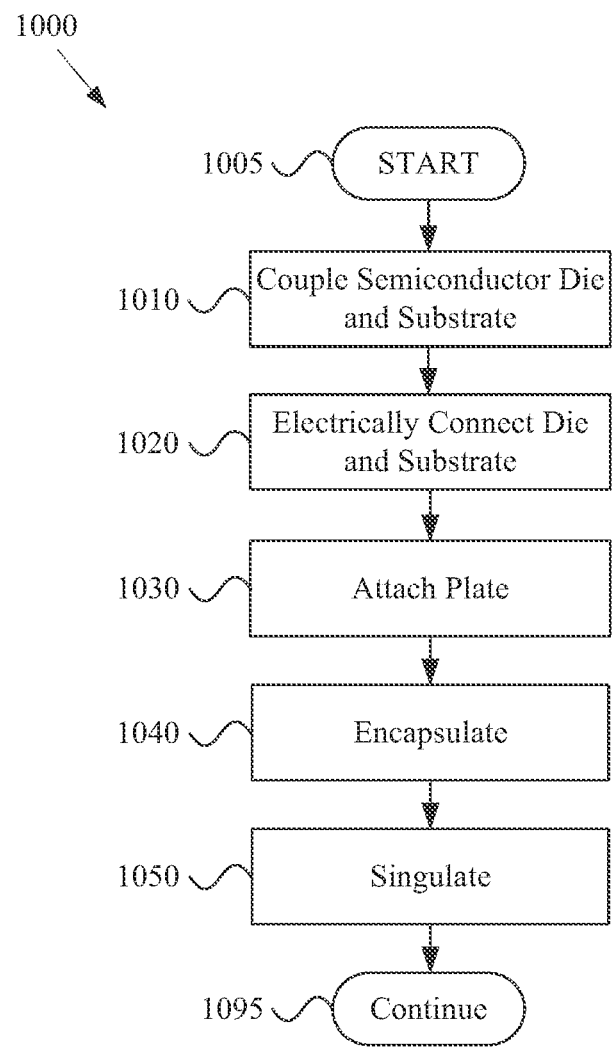
FIG. 1 shows a flow diagram of an example method of making a sensor device, in accordance with various aspects of the present disclosure.

Various aspects of this disclosure provide a fingerprint sensor device and a method of making a fingerprint sensor device. As non-limiting examples, various aspects of this disclosure provide various fingerprint sensor devices, and methods of manufacturing thereof, that comprise an interconnection structure, for example a bond wire, at least a portion of which extends into a dielectric layer utilized to mount a plate, and/or that comprise an interconnection structure that extends upward from the semiconductor die at a location that is laterally offset from the plate.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

Further, it should be understood that when an element A is referred to as being "connected to" or "coupled to" an element B, the element A can be directly connected to the element B or indirectly connected to the element B (e.g., an intervening element C (and/or other elements) may be positioned between the element A and the element B).

It should be understood that although the examples presented herein primarily concern fingerprint sensors and manufacturing methods thereof, the scope of this disclosure is not limited thereto. The various aspects of this disclosure, for example, are readily applicable to other forms of sensors (e.g., blood vessel sensors, temperature sensors, humidity sensors, image sensors, general biometric sensors, eye or retinal sensors, voice sensors, material detectors, etc.).

Additionally, it should be understood that the examples present herein are not limited to any particular type of fingerprint sensing (e.g., an optical sensing type, a semiconductor sensing type, etc.). In an example scenario involving a semiconductor sensing type of fingerprint sensor, the various examples presented herein are not limited to any particular type of such sensing (e.g., utilizing a temperature and/or pressure sensor, utilizing a capacitance sensor, etc.). Further, it should be understood that the examples presented herein may apply to a so-called single sensing device or technique, in which the entire fingerprint is sensed at one time (e.g., as a finger is placed, etc.), and/or to a so-called continuous sensing device or technique, in which partially scanned fingerprints are continuously (or serially) sensed (e.g., as a finger is swiped, etc.).

Various aspects of the present disclosure provide a fingerprint sensor package (or device) that can simplify a manufacturing (or fabricating) process thereof, for example by attaching a dielectric (or insulation) film, which does not interfere with a conductive wire (e.g., a bond wire, etc.), to a bottom surface of a plate (e.g., a transparent plate, etc.), and then attaching the plate having the dielectric film attached thereto to a planar top surface of a semiconductor die.

Various aspects of the present disclosure also provide a fingerprint sensor package (or device) that can simplify a manufacturing (or fabricating) process thereof by attaching a plate (e.g., a transparent plate, etc.) in a manner that exposes a bond pad on an outer perimeter of a planar top surface of a semiconductor die, such that the plate does not interfere with a conductive wire (e.g., a bond wire, etc.) connected to the bond pad.

Various aspects of the present disclosure also provide a fingerprint sensor package (or device), where the fingerprint sensor package includes a substrate including a plurality of conductive patterns; a semiconductor die having a planar top surface having a plurality of bond pads thereon and mounted on a top surface of the substrate; a conductive wire electrically connecting the bond pads of the semiconductor die and the conductive patterns of the substrate; a dielectric layer (e.g., an insulative film, etc.) attached to the top surface of the semiconductor die; a plate (e.g., a transparent plate, etc.) attached to a top portion (or side) of the dielectric layer; and an encapsulating material (e.g., an insulative molding material, etc.) covering the top surface of the substrate, the conductive wire and side portions of the semiconductor die.

Various aspects of the present disclosure additionally provide a fingerprint sensor package (or device), where the fingerprint sensor package includes a substrate including a plurality of conductive patterns; a semiconductor die having a planar top surface having a plurality of bond pads thereon and mounted on a top surface of the substrate; a conductive wire electrically connecting the bond pads of the semiconductor die and the conductive patterns of the substrate; a plate (e.g., a transparent plate, etc.) attached to a top portion (or side) of the dielectric layer so as to be laterally offset from the plurality of bond pads; and an encapsulating material (e.g., an insulative molding material, etc.) covering the top surface of the substrate, the conductive wire and the semiconductor die.

Various aspects of the present disclosure provide a fingerprint sensor device (or package) and a method of manufacturing thereof that includes: a substrate having a top substrate side, a bottom substrate side, and lateral substrate sides between the top and bottom substrate sides, the substrate comprising a conductive layer on the top substrate side; a semiconductor die having a top die side, a bottom die side, and lateral die sides between the top and bottom die sides, the semiconductor die comprising a bond pad on the top die side; a conductive interconnection structure electrically connecting the bond pad and the conductive pattern; a dielectric layer (DL) having a top DL side, a bottom DL side coupled to the top die side, and lateral DL sides between the top and bottom DL sides; a plate through which a fingerprint is sensed, the plate having a top plate side, a bottom plate side coupled to the top DL side, and lateral plate sides between the top and bottom plate sides; and an encapsulating material covering the top substrate side, the lateral die sides, and the conductive interconnection structure.

The conductive interconnection structure may, for example, include a bond wire. The dielectric layer may, for example, surround an upper portion of the bond wire, and the encapsulating material may surround a lower portion of the bond wire. The dielectric layer may, for example, include an adhesive layer that adheres the bottom plate side to the top die side. The dielectric layer may, for example, cover the entire top die surface. The plate may, for example, comprise a glass. The encapsulating material may, for example, cover only a portion of the top die side that is not covered by the plate. The encapsulating material may, for example, cover the lateral DL sides and the lateral plate sides. The dielectric layer may, for example, be formed of a different material than the encapsulating material. The dielectric layer may, for example, comprise a preformed sheet. The plate may, for example, cover the entire top die side but cover less than the entire top substrate side. The top die side may, for example, comprise a planar and uppermost surface of the semiconductor die.

Various aspects of the present disclosure provide a fingerprint sensor device (or package) that includes: a substrate having a top substrate side, a bottom substrate side, and lateral substrate sides between the top and bottom substrate sides, the substrate comprising a conductive pattern on the top substrate side; a semiconductor die having a top die side, a bottom die side, and lateral die sides between the top and bottom die sides, where the top die side comprises an uppermost planar side of the semiconductor die and the semiconductor die comprises a bond pad on the top die side; a bond wire electrically connecting the bond pad and the conductive pattern; an encapsulating material surrounding the lateral die sides and having a top encapsulant side that is coplanar with the top die side, a bottom encapsulant side, and lateral encapsulant sides between the top and bottom encapsulant sides; and a dielectric layer (DL) having a top DL side, a bottom DL side coupled to the top die side and to the top encapsulant side, and lateral DL sides between the top and bottom DL sides, wherein the dielectric layer covers the entire top die side and at least a portion of the top encapsulant side.

The fingerprint sensor device may, for example, include a plate through which a fingerprint is sensed, the plate having a top plate side, a bottom plate side coupled to the top DL side, and lateral plate sides between the top and bottom plate sides. The dielectric layer may, for example, comprise an adhesive that adheres the bottom plate side to the top die side. The dielectric layer may, for example, contact and surround at least a first portion of the bond wire, and the encapsulating material contacts and surrounds at least a second portion of the bond wire.

Various aspects of the present disclosure provide a fingerprint sensor device (or package) that includes: a substrate having a top substrate side, a bottom substrate side, and lateral substrate sides between the top and bottom substrate sides, the substrate comprising a conductive pattern on the top substrate side; a semiconductor die having a top die side, a bottom die side, and lateral die sides between the top and bottom die sides, where the top die side comprises an uppermost planar side of the semiconductor die and the semiconductor die comprises a bond pad on the top die side; a bond wire electrically connecting the bond pad and the conductive pattern; an encapsulating material surrounding the lateral die sides and having a top encapsulant side, a bottom encapsulant side, and lateral encapsulant sides between the top and bottom encapsulant sides; a dielectric layer (DL) having a top DL side, a bottom DL side coupled to the top die side, and lateral DL sides between the top and bottom DL sides; and a plate through which a fingerprint is sensed, the plate having a top plate side, a bottom plate side coupled to the top DL side, and lateral plate sides between the top and bottom plate sides, where the plate is positioned over only a portion of the top die side that is laterally offset from the bond pad.

The dielectric layer may, for example, include an adhesive layer that adheres the bottom plate side to the top die side. The encapsulating material may, for example, cover only a portion of the top die side that is not covered by the plate. The encapsulating material may, for example, cover the lateral DL sides and the lateral plate sides.

The above and other aspects of the present disclosure will be described in or be apparent from the following description of various example implementations. Various aspects of the present disclosure will now be presented with reference to accompanying drawings.

Note that although the examples provided herein are generally presented in the context of forming of a plurality of fingerprint sensor devices (e.g., in wafer or panel form) followed by singulation, the scope of this disclosure is not limited thereto. For example, in an example implementation, for the entire manufacturing process or any portion thereof, a fingerprint sensor device may be manufactured singularly.

FIG. 1 shows a flow diagram of an example method 1000 of making a sensor device (e.g., a fingerprint sensor device), in accordance with various aspects of the present disclosure. The example method 1000 may, for example, share any or all characteristics with any other method discussed herein (e.g., the example methods discussed with regard to FIGS. 2A-2E, FIG. 3, FIGS. 4A-4C, etc.). FIGS. 2A-2E show cross-sectional views illustrating example sensor devices and example methods of making sensor devices, in accordance with various aspects of the present disclosure. The structures shown in FIGS. 2A-2E may share any or all characteristics with analogous structures shown in FIG. 3, FIGS. 4A-4C, etc. FIGS. 2A-2E may, for example, illustrate an example sensor device (e.g., a fingerprint sensor device) at various stages (or blocks) of the example method 1000 of FIG. 1. FIGS. 1 and 2A-2E will now be discussed together. It should be noted that the order of the example blocks of the example method 1000 may vary, various blocks may be omitted, and/or various blocks may be added without departing from the scope of this disclosure.

In general, the example method 1000 may comprise coupling a semiconductor die and a substrate (block 1010), electrically connecting the semiconductor die to the substrate (block 1020), attaching a plate (block 1030), encapsulating (block 1040), and singulating (block 1050).

The example method 1000 may begin executing at block 1005. The example method 1000 may begin executing in response to any of a variety of causes or conditions, non-limiting examples of which are provided herein. For example, the example method 1000 may begin executing in response to receiving a process flow from another block of the example method 1000 or another method (e.g., the example methods relating to FIGS. 2A-2E, FIG. 3, FIGS. 4A-4C, or any portions thereof, etc.). Also for example, the example method 1000 may begin executing in response to the arrival of materials utilized by the method 1000, in response to the availability of processes or equipment or other resources utilized by the method 1000, etc. Additionally, for example, the example method 1000 may begin executing in response to a user and/or automated command to begin (e.g., from a process controller, safety system, etc.). In general, the example method 1000 may begin executing in response to any of a variety of causes or conditions. Accordingly, the scope of this disclosure is not limited by characteristics of any particular initiating cause or condition.

The example method 1000 may, at block 1010, comprise coupling a semiconductor die and a substrate. Block 1010 may comprise performing such coupling in any of a variety of manners, non-limiting examples of which are provided herein.

Block 1010 may, for example, comprise providing (e.g., receiving and/or preparing, etc.) a semiconductor die in any of a variety of manners. For example, block 1010 may comprise receiving the semiconductor die in a completely prepared or partially prepared state. For example, block 1010 may comprise receiving the fully or partially prepared die from a fabrication facility or associated distribution facility at a different geographical location, from an upstream manufacturing process at a same general geographical location, etc. For example, any or all of the semiconductor die-preparing activities discussed herein may be performed on-site or off-site in relation to any other processing activity discussed herein.

The semiconductor die may, for example, comprise a first die side (e.g., a planar top die side or surface, etc.), a second die side (e.g., a planar bottom die side or surface, etc.), and one or more peripheral die sides (e.g., planar lateral die sides or surfaces, etc.) between the first die side and the second die side. In an example implementation the entire first side and the entire second side of the semiconductor die may be planar (e.g., without a step or notch at a peripheral edge thereof, for example to make room for bond wires or other features, etc.).

Though not explicitly shown, the first die side of the semiconductor die may, for example, comprise a fingerprint sensing unit. The fingerprint sensing unit may, for example, comprise fingerprint sensing circuitry (e.g., traces, electrodes, optical elements, capacitive sensing elements, etc.) and/or fingerprint processing circuitry (e.g., logic circuitry that operates to process or analyze fingerprint-related signals received from fingerprint sensing circuitry, etc.). The fingerprint sensing unit may, for example, detect fingerprints by sensing and analyzing capacitance (e.g., changes in, or patterns of, capacitance), optical imagery (e.g., for visible and/or invisible radiation), temperature, pressure, etc. The portion of the fingerprint sensing unit (e.g., on the first die side of the semiconductor die) that senses fingerprint characteristics may generally be referred to herein as a fingerprint sensing area. In an example implementation, the fingerprint sensing area may be located in a central (or centered) region of the semiconductor die. The fingerprint sensing area may, for example, be rectangular, square, etc. The semiconductor die, for example in a top view, may similarly for example be square, rectangular, etc.

The second die side of the semiconductor die may, for example, comprise bulk semiconductor material. Such bulk semiconductor material may, for example, be thinned as much as possible yet provide structural support for the sensor circuitry on the first die side. Although the examples herein are primarily presented in the context of a wire-bonded semiconductor die, it should be understood that the scope of this disclosure is not limited thereto. For example, the second die side may comprise various types of interconnection structures, for example electrically connected to the first die side by conductive vias (e.g., through silicon vias, etc.) or other conductive pathways through the semiconductor die. Such conductive interconnection structures may, for example, comprise conductive bumps or balls (e.g., solder bumps or balls, etc.), metal pillars or posts (e.g., copper pillars or posts, etc.), etc. Additionally, interconnection structures other than bond wires (e.g., plated traces, etc.) may be utilized.

In an example implementation, the first die side may comprise die interconnection pads (e.g., bond pads, traces, lands, patterns, etc.). Such die interconnection pads may, for example, be utilized for electrically connecting the semiconductor die to another component (e.g., a substrate, generally signal distribution structure, another die, passive component, power source, signal source or sink, etc.). Such die interconnection pads may, for example, be positioned on the first die side outside of (and/or around) the perimeter of the sensing area of the sensing unit. For example, such die interconnection pads may surround the sensing unit (or sensing area) on any number of sides (e.g., on one side, two sides, four sides, three sides, etc.).

The die interconnection pads may, for example, comprise any of a variety of conductive materials (e.g., copper, aluminum, silver, gold, nickel, alloys thereof, etc.). A die interconnection pad may, for example, be exposed through an aperture in a dielectric layer (e.g., a top dielectric layer) on the first die side. The dielectric layer may, for example, cover side surfaces of the die interconnection pad and/or an outer perimeter of the top surface of the die interconnection pad.

Block 1010 may comprise preparing the semiconductor die in any of a variety of manners. For example, to obtain the desired thinness (or thickness) of the semiconductor die, block 1010 may comprise thinning the semiconductor die to the desired thickness. For example, block 1010 may comprise grinding the second die side of the semiconductor die (e.g., a back or inactive side of the semiconductor die) to achieve the desired thickness. Also for example, block 1010 may comprise performing the thinning by utilizing chemical/mechanical planarization (CMP) and/or any other type of thinning process. Block 1010 may, for example, comprise thinning the semiconductor die as a single die or as a wafer of die, for example in a wafer thinning process. In such manner, the semiconductor die may be singulated (or diced) from the wafer after the thinning.

It should be noted that although the example presented herein generally concerns a single semiconductor die, any number of semiconductor die and/or other electronic components may also be provided and coupled with the substrate.

Figure 2A:
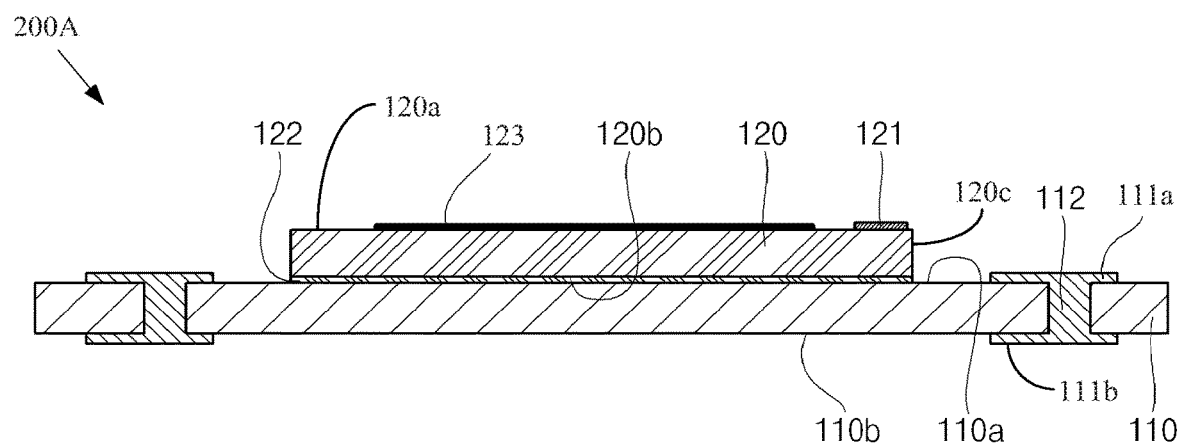
FIGS. 2A-2E show cross-sectional views illustrating example sensor devices and example methods of making sensor devices, in accordance with various aspects of the present disclosure.

An example implementation 200A showing various aspects of block 1010 is shown at FIG. 2A. The example implementation 200A (or assembly, sub-assembly, package, etc.) comprises a semiconductor die 120 having a first die side 120*a* (e.g., a planar top die side or surface, etc.), a second die side 120*b* (e.g., a planar bottom die side or surface, etc.), and one or more peripheral die sides 120*c* (e.g., planar lateral die sides or surfaces, etc.) between the first die side 120*a* and the second die side 120*b*. In the example implementation 200A the entire first die side 120*a* and the entire second die side 120*b* of the semiconductor die 120 are planar (e.g., without a step or notch at a peripheral edge thereof, etc.).

The first die side 120*a* of the example semiconductor die 120 comprises a fingerprint sensing unit 123, which is shown in FIG. 2A but not in other figures for illustrative clarity. The example fingerprint sensing unit may for example comprise fingerprint sensing circuitry (e.g., traces, electrodes, optical elements, capacitive sensing elements, etc.) and/or fingerprint processing circuitry (e.g., logic circuitry that operates to process or analyze fingerprint-related signals received from fingerprint sensing circuitry, etc.). The fingerprint sensing unit may, for example, detect fingerprints by sensing capacitance (e.g., changes in, or patterns of, capacitance), optical imagery (e.g., for visible and/or invisible radiation), temperature, pressure, etc. The portion of the fingerprint sensing unit (e.g., on the first die side 120*a* of the semiconductor die 120) that senses fingerprint characteristics may generally be referred to herein as a fingerprint sensing area. In an example implementation, the fingerprint sensing area may be located in a central (or centered) region of the first die side 120*a*. The fingerprint sensing area may, for example, be rectangular, square, etc. The semiconductor die 120, for example in a top view, may similarly be square, rectangular, etc.

In the example implementation 200A, the first die side 120*a* comprises a die interconnection pad 121 (e.g., pad, land, trace, pattern, etc.). Though only one die interconnection pad 121 is shown, it should be understood that any number of such pads may be present. The example die interconnection pad 121, as discussed herein, is utilized for electrically connecting the semiconductor die 120 to the substrate 110. The example die interconnection pad 121 may, for example, be positioned on the first die side 120*a* outside of (and/or around) the perimeter of the sensing area of the sensing unit. For example, a plurality of the example die interconnection pads 121 may border or surround the sensing unit (or sensing area) on any number of sides (e.g., on one side, two sides, four sides, three sides, etc.). In the example implementation 200A, the example die interconnection pad 121 is shown laterally offset toward one perimeter side of the semiconductor die 120, but the scope of this disclosure is not limited thereto.

The example die interconnection pad 121 may, for example, comprise any of a variety of conductive materials (e.g., copper, aluminum, silver, gold, nickel, alloys thereof, etc.). The example die interconnection pad 121 may, for example, be exposed through an aperture in a dielectric layer (e.g., a top dielectric layer) on the first die side 120*a*. Such a dielectric layer, if present, may for example cover side surfaces of the die interconnection pad 121 and/or an outer perimeter of the top surface of the die interconnection pad 121.

In general, block 1010 may comprise providing a semiconductor die. Accordingly, the scope of this disclosure should not be limited by characteristics of any particular type of semiconductor die or of any particular manner of providing a semiconductor die.

In addition to providing the semiconductor die, block 1010 may also comprise coupling the semiconductor die and a substrate. Block 1010 may comprise coupling the semiconductor die (and/or other semiconductor die or other electronic components) and the substrate in any of a variety of manners, non-limiting examples of which are provided herein.

Block 1010 may, for example, comprise coupling the semiconductor die and a substrate that comprises any of a variety of characteristics. For example, the substrate may comprise a circuit board material (e.g., FR-4 glass epoxy, G-10 woven glass and epoxy, FR-n with n=1 to 6, CEM-m with m=1 to 4, laminate, laminate thermoset resin, copper-clad laminate, resin impregnated B-state cloth (pre-preg), polytetrafluoroethylene, combinations thereof, equivalents thereof, etc.). The substrate may also, for example, be coreless. The substrate may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto. The substrate may, for example, comprise silicon or any of a variety of semiconductor materials. The substrate may also, for example, comprise a glass (e.g., glass, sapphire glass, reinforced glass, etc.) or metal plate (or wafer). The substrate may comprise any of a variety of configurations. For example, the substrate may be in wafer or panel form. The substrate may also, for example, be in diced or singulated form.

The substrate may, for example, be or comprise only a bulk material with no conductive routing paths. Alternatively for example, the substrate may comprise one or more conductive layers, vias, and or signal distribution structures. For example, the substrate may comprise conductive vias extending into the substrate from the top surface thereof to or toward the bottom surface thereof. Also for example, instead of (or in addition to) conductive vias extending straight through the substrate, the substrate may comprise conductive paths that extend between top and bottom surfaces of the substrate in an indirect path (e.g., in a conductive path comprising a combination of vertical and lateral conductive path segments or portions).

Block 1010 may, for example, comprise coupling (or mounting or attaching) the semiconductor die and the substrate in any of a variety of manners. For example, block 1010 may comprise coupling the semiconductor die and the substrate utilizing an adhesive layer. For example, the second die side (e.g., bottom die side, etc.) may be coupled to the first substrate side (e.g., top substrate side, etc.) utilizing an adhesive layer between the semiconductor die and the substrate. In an example implementation, such coupling might only be mechanical (e.g., electrical interconnection being performed in a different process). In other example implementations, however, such coupling may mechanically and electrically couple the semiconductor die and the substrate in a same process.

Referring now to the example implementation 200A of FIG. 2A. The example implementation 200A (or assembly, sub-assembly, package, etc.) comprises the semiconductor die 110, where the second die side 120b (e.g., the bottom die side, etc.) is coupled to the first substrate side 110a (e.g., the top substrate side, etc.) with an adhesive layer 122 between the semiconductor die 120 and the substrate 110.

An example conductive layer 111a (e.g., pattern, trace, pad, land, etc.), to which the example die interconnection pad 121 will be electrically connected (e.g., at block 1020), is on the first substrate side 110a. An example conductive layer 111b (e.g., pattern, trace, pad, land, etc.), which is electrically connected to the example conductive layer 111a by the conductive via 112 through the substrate 110, is on the second substrate side 110b. Note that although the conductive via 112 is shown as a straight-through via, the conductive via 112 may also follow an indirect route (e.g., utilizing multiple layers of interconnections) through the body of the substrate 110. The conductive layer 111b on the second substrate side 110b may, for example, be utilized to connect the fingerprint sensor device to another circuit (e.g., in a package-on-package configuration, to a substrate of a multi-chip module, to a motherboard, etc.).

Note that although the examples provided herein generally concern coupling a single semiconductor die and a substrate, any number of die and/or other electronic components may also be coupled.

In general, block 1010 may comprise coupling (or mounting or attaching) the semiconductor die and the substrate. Accordingly, the scope of this disclosure should not be limited by characteristics of any particular type of semiconductor die or of any particular manner of coupling a semiconductor die and a substrate.

The example method 1000 may, at block 1020, comprise electrically connecting the semiconductor die to the substrate. Block 1020 may comprise performing such electrically connecting in any of a variety of manners, non-limiting examples of which are provided herein. Note that in an example implementation in which all of the electrical connecting was performed at block 1010, block 1020 may be omitted.

Block 1020 may, for example, comprise electrically connecting the die interconnection pad (or a plurality thereof) on the first die side to a respective conductive layer (e.g., pattern, pad, trace, land, etc.) on the first substrate side. Such electrically connecting may, for example, comprise wire-bonding, metal plating or depositing, etc.

Although the examples shown and discussed herein generally concern performing the electrical connecting by wire-bonding, the scope of this disclosure is not limited thereto. For example, any of a variety of electrical interconnection structures may be utilized.

For example, block 1020 may, for example, comprise coupling and/or electrically connecting the semiconductor die to the substrate utilizing any of a variety of types of interconnection structures (e.g., conductive balls or bumps, solder balls or bumps, metal posts or pillars, copper posts or pillars, solder-capped posts or pillars, solder paste, conductive adhesive, etc.). Block 1020 may comprise electrically connecting the semiconductor die and the substrate utilizing any of a variety of bonding techniques (e.g., thermocompression (TC) bonding, thermocompression non-conductive paste (TCNCP) bonding, mass reflow, adhesive attachment, etc.). In an example implementation, block 1020 may comprise utilizing conductive bumps to electrically connect die interconnection pads (e.g., pads, traces, lands, patterns, etc.) of the semiconductor die to respective conductive layers (e.g., patterns, traces, lands, pads, etc.) of the substrate. As discussed herein, such die interconnection pads may, for example, be exposed through respective openings (or apertures) in a dielectric layer (or passivation layer) on the semiconductor die. Similarly, such conductive layers on the substrate may, for example, be exposed through respective openings (or apertures) in a dielectric layer (or passivation layer) on the substrate.

Figure 2B:
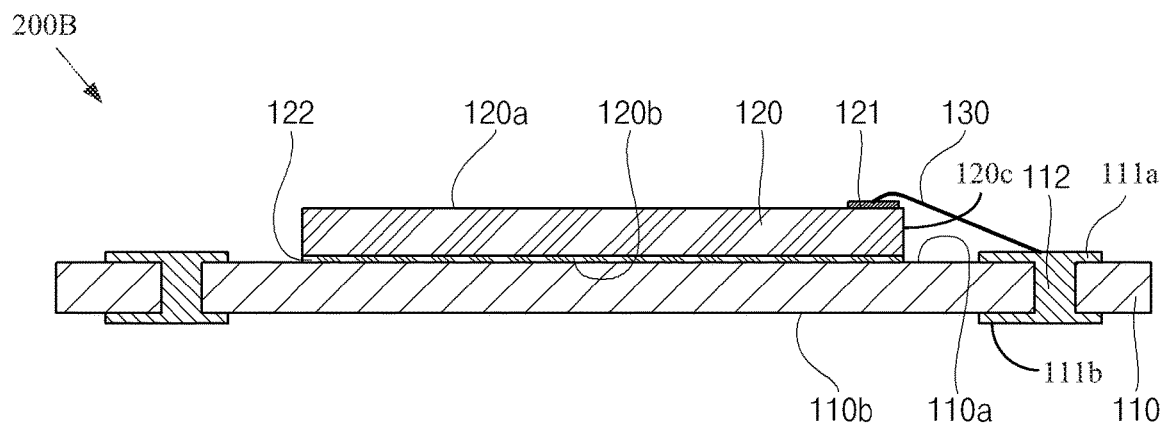

An example implementation 200B showing various aspects of block 1020 is shown at FIG. 2B. The example implementation 200B (or assembly, sub-assembly, package, etc.) comprises the semiconductor die 120 and the substrate 110, as discussed with regard to block 1010 and FIG. 2A. The die interconnection pad 121 on the first die side 120a is electrically connected to the conductive layer 111a on the first substrate side 110a with a bond wire 130. The example conductive layer 111a is also electrically connected to the conductive via 112 extending through the substrate 110 from the top substrate side 110a to the bottom substrate side 110b. The conductive via 112, in turn, is electrically connected to the conductive layer 111b on the second substrate side 111b. Such a conductive layer 111b may, for example, be utilized to connect the fingerprint sensor device to another circuit (e.g., utilizing any of the example conductive interconnection structures discussed herein, etc.).

Note that although the examples provided herein generally concern connecting a single semiconductor die, any number of die and/or other electronic components may also be connected.

In general, block 1020 may comprise electrically connecting the semiconductor die to the substrate. Accordingly, the scope of this disclosure should not be limited by characteristics of any particular type of semiconductor die or of any particular manner of connecting a semiconductor die to a substrate.

The example method 1000 may, at block 1030, comprise attaching a plate. Block 1030 may comprise attaching (or forming) the plate in any of a variety of manners, non-limiting examples of which are provided herein.

In an example implementation, block 1030 may comprise attaching a performed plate to the semiconductor die utilizing a dielectric layer (e.g., an adhesive layer, etc.), but the scope of the present disclosure is not limited thereto. For example, a plate (or protective layer) may be formed on (or over) the semiconductor die in any of a variety of manners (e.g., molding, printing, depositing, etc.).

The dielectric layer (DL) (e.g., an adhesive layer, etc.) may, for example, have a first DL side (e.g., a top planar DL side surface, etc.), a second DL side (e.g., a bottom planar DL side or surface, etc.), and peripheral DL sides (e.g., lateral DL sides or surfaces, etc.) between the first and second DL sides. The second DL side may, for example, directly contact and/or cover the first die side (e.g., top die side, etc.) of the semiconductor die connected at block 1020. The first DL side may, for example, directly contact and/or cover a side of the plate (discussed herein).

In an example implementation, the dielectric layer may be or comprise a non-conductive adhesive (e.g., comprising one or more dielectric materials) that electrically isolates the entire first die side of the semiconductor die, for example providing no electrically conductive paths between the first die side of the semiconductor die and a component (e.g., the plate, etc.) adhered to a side of the dielectric layer opposite the semiconductor die. Note that the dielectric layer material may be different from the encapsulating material formed at block 1040, but may be the same.

The dielectric layer may, for example, be sized larger than the first die side of the semiconductor die. In another example implementation, the area of the dielectric layer may be smaller than the first die side of the semiconductor die, for example leaving a portion of the first die side of the semiconductor die uncovered by the dielectric layer. Also for example, the area of the dielectric layer may match the area of the first die side of the semiconductor die.

In an example implementation, the dielectric layer (e.g., adhesive layer, etc.) may encapsulate (e.g., cover, surround, and/or contact, etc.) at least a portion of the interconnection structure(s) utilized at block 1020. For example, in an example implementation in which one or more bond wires are utilized to electrically connect the semiconductor die to the substrate, the dielectric layer may encapsulate at least a portion (e.g., an upper portion, etc.) of the bond wire(s). For example, at least the portion of the bond wire(s) above the level of the top die side may be encapsulated by the dielectric layer. Note that in an example implementation in which the dielectric layer is sized to overhang the periphery of the semiconductor die, a portion of the bond wire(s) outside of the footprint of the semiconductor die may also be encapsulated by the dielectric layer. Also note that in an example implementation in which the dielectric layer is sized smaller than the area of the first die side, a bond wire extending from the first die side need not be encapsulated by the dielectric layer (but may be, depending on the positioning of the dielectric layer).

In an example implementation, the dielectric layer may be considered to exhibit film-over-wire (FOW) properties. FOW properties may, for example, generally refer to properties in which the dielectric layer 140 comprises gel (or paste etc.) properties, for example allowing wire structures (e.g., bond wires, etc.) or other interconnection structures (e.g., bond pads, etc.) to be encapsulated in the dielectric layer 140 upon formation or placement of the dielectric layer 140. Note that such gel properties may, for example, generally disappear when the dielectric layer 140 cures, but at least some compliance may remain.

The dielectric layer (e.g., an adhesive layer, etc.) may comprise any of a variety of characteristics. For example, the dielectric layer may comprise an adhesive liquid or paste or gel, a preformed adhesive sheet or film, an insulation film, etc. In an example implementation, the dielectric layer may have a gel-like or paste-like consistency when the plate is attached, which then turns to a solid consistency when cured. In an example implementation, the dielectric layer may be transparent, but the scope of this disclosure is not limited thereto.

Block 1030 may comprise forming the dielectric layer (e.g., adhesive layer, etc.) in any of a variety of manners. For example, block 1030 may comprise forming the dielectric layer by photolithography, screen printing, dispensing and spreading or squeegeeing, printing, brushing, dipping, laminating a preformed sheet or film, etc.

The plate may, for example, have a first plate side (e.g., a top planar plate side or surface, etc.), a second plate side (e.g., a bottom planar plate side or surface, etc.), and peripheral plate sides (e.g., lateral plate sides or surfaces, etc.) between the first and second plate sides.

The plate (or layer), which may also be referred to a protective plate, may comprise any of a variety of characteristics. The plate may, for example, protect the semiconductor die from external forces and/or contaminants (e.g., due to finger pressing, swiping, etc.). The plate may, for example, cover at least the first die side of the semiconductor die. In an example implementation, the plate may have a larger area than the semiconductor die (e.g., overhanging the semiconductor die). The plate may also, for example, have a same size as the substrate, for example forming an entire top side of the fingerprint sensor device. Though the example plate may comprise a preformed plate of material (e.g., formed prior to the attachment at block 1030), the scope of this disclosure is not limited thereto. For example, the plate may be formed as (or after) its material is deposited on the dielectric layer.

The plate may comprise any one or more of a variety of materials. For example, the protective plate may comprise one or more of glass, sapphire, sapphire glass, reinforced glass, plastic, polycarbonate (PC), polyamide (PI), etc., but aspects of the present disclosure are not limited thereto. In an example implementation, the plate may comprise an alumina coating. For example, block 1030 may comprise forming an alumina coating (or other coating) on the plate by particle impact (or mechanical impact), thermal spraying, plasma spraying, high-velocity oxygen-fuel (HVOF) spraying, etc.

Note that, in various example implementations, the plate may be or comprise a plate of another device (e.g., a consumer electronic device in which the fingerprint sensor device is integrated). For example, the plate may be a portion of a larger plate (e.g., window, coating, display screen, etc.).

In an example implementation, the first dielectric layer side (e.g., top dielectric layer side, etc.) may be adhered to the second plate side (e.g., bottom plate side, etc.), and the second dielectric layer side (e.g., bottom dielectric layer side, etc.) may be adhered to the first die side (e.g., top die side, etc.).

Block 1030 may, for example, comprise first forming the dielectric layer on the plate, and then positioning the plate with the dielectric layer on the semiconductor die. In another example scenario, however, block 1030 may comprise first forming the dielectric layer on the first die side and then positioning the plate on the first die side with the dielectric layer.

Figure 2C:
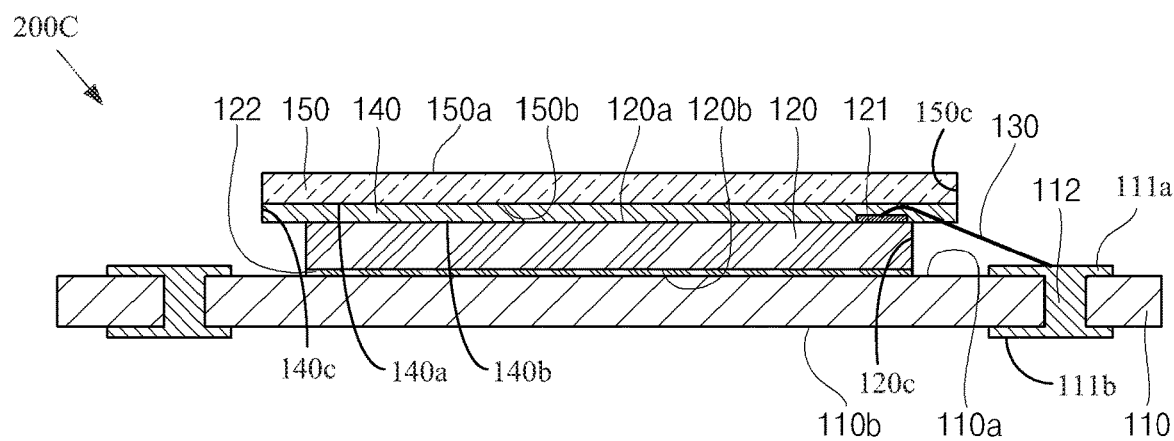

An example implementation 200C showing various aspects of block 1030 is shown at FIG. 2C. The example implementation 200C (or assembly, sub-assembly, package, etc.) comprises a dielectric layer 140 on (e.g., directly on, etc.) the top die side 120a of the semiconductor die 120. The second DL side 140b is adhered to the first die side 120a. The first DL side 140b is adhered to the second plate side 150b.

The example dielectric layer 140 has a uniform thickness and is sized larger the area of the first die side 120a of the semiconductor die 120. The example dielectric layer 140 may, for example, comprise a continuous layer of non-conductive adhesive, for example providing no electrically conductive paths between the first die side 120a of the semiconductor die 120 and the second plate side 150b of the plate 150. In an alternative implementation, however, the dielectric layer 140 may comprise apertures (or openings) through which conductive contact may be made with another component.

The dielectric layer 140 encapsulates (e.g., covers, surrounds, and/or contacts, etc.) a top portion of the bond wire 130. For example, a first portion of the dielectric layer 140 that is positioned directly above the semiconductor die 120 (e.g., within the footprint of the semiconductor die 120) encapsulates a first portion of the bond wire 130, and a second portion of the dielectric layer 140 that overhangs the semiconductor die 140 (e.g., outside of the footprint of the semiconductor die 120) encapsulates a second portion of the bond wire 130. At this point in the manufacturing process, a third (e.g., lower, etc.) portion of the bond wire 130 is exposed (which may for example, be encapsulated at block 1040).

After forming the dielectric layer and/or attaching the plate to the semiconductor die, the dielectric layer (which may be in an uncured or semi-cured state) may be cured to harden the dielectric layer.

The first plate side 150a (e.g., top plate side, etc.) is exposed, for example for contact with or at least being in close proximity with a finger being sensed. The example plate 150 is shown having an area that is substantially larger than the area of the semiconductor die 120, for example overhanging the peripheral edges of the semiconductor die 120.

In general, block 1030 may comprise attaching a plate. Accordingly, the scope of this disclosure should not be limited by characteristics of any particular type of plate or of any particular manner of attaching a plate.

The example method 1000 may, at block 1040, comprise encapsulating. Block 1040 may comprise encapsulating (e.g., the semiconductor die, the substrate, the plate and/or dielectric layer, etc.) in any of a variety of manners, non-limiting examples of which are provided herein.

Block 1040 may, for example, comprise forming encapsulating material that covers at least the first substrate side (e.g., a top substrate side, etc.) of the substrate to which the semiconductor die was mounted at block 1010. The encapsulating material may, for example, have a second encapsulant side (e.g., bottom side or surface, etc.) that covers the first substrate side (e.g., parts not already covered by the semiconductor die, etc.).

The encapsulating material may also, for example, cover and surround at least the peripheral die sides of the semiconductor die. The encapsulating material may also, for example, cover and surround at least the peripheral die sides of the dielectric layer and/or plate.

In an example implementation, the encapsulating material may comprise a first encapsulant side (e.g., a top encapsulant side or surface, etc.) that is coplanar with the first die side (e.g., top die side or surface, etc.). For example, the dielectric layer and/or plate attached at block 1030 may bound the first encapsulant side (e.g., the top encapsulant side or surface, etc.).

Also, in an example implementation, the encapsulating material may comprise a first encapsulant side (e.g., a top encapsulant side or surface, etc.) that is coplanar with the first plate side (e.g., top plate side or surface, etc.). In an alternative implementation, however, the encapsulating material may cover the first plate side of the plate (or for example a peripheral portion thereof). For example, the encapsulating material may comprise a first encapsulant side that is higher than the first plate side and comprises an aperture exposing the first plate side (or a portion thereof).

In various example implementations, for example in which the plate and/or dielectric layer do not completely cover the first die side, the encapsulating material may also cover the portion of the first die side that is not covered by the dielectric layer and/or the plate.

The encapsulating material may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The encapsulating material may, for example, comprise any one or more of polyimide (PI), benzocyclobutene (BCB), polybenzoxazole (PBO), bismaleimide-triazine (BT), phenolic resin, any of the dielectric materials discussed herein, etc. In various example implementations, the encapsulating material may, for example, be opaque.

Block 1040 may comprise forming the encapsulating material in any of a variety of manners (e.g., compression molding, transfer molding, liquid encapsulant molding, vacuum lamination, paste printing, film assisted molding, etc.). In an example implementation, block 1040 may comprise utilizing a sealed mold chase or film-assisted molding technique to keep the first plate side (e.g., top plate side or surface, etc.) of the plate free of encapsulating material. In another example implementation, block 1040 may comprise initially forming the encapsulating material to cover the first plate side of the plate and then thin the encapsulating material until the first plate side of the plate is exposed from the encapsulating material. In an example implementation, block 1040 may comprise forming the encapsulating material in empty spaces between the dielectric layer (and/or plate) and the substrate.

Figure 2D:
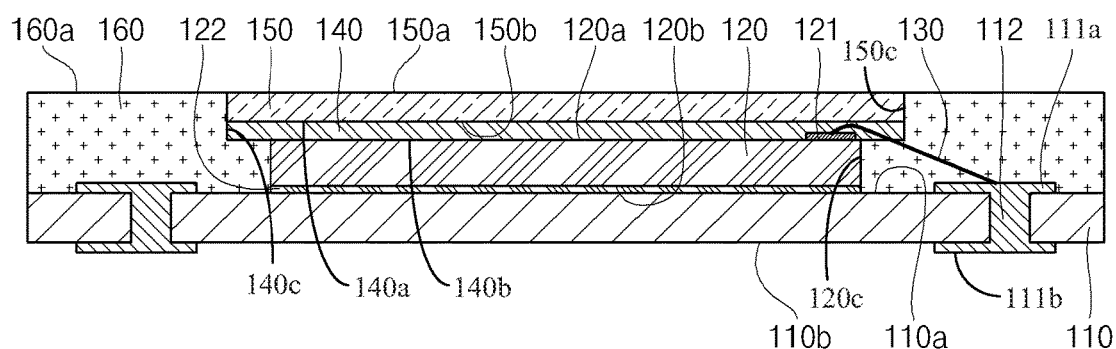

An example implementation 200D showing various aspects of block 1040 is shown at FIG. 2D. The example implementation 200D (or assembly, sub-assembly, package, etc.) comprises an encapsulating material 160 that covers at least a portion of the first substrate side 110*a* (e.g., top substrate side, etc.) of the substrate 110. The example encapsulating material 160 also covers conductive layers 111*a* (e.g., traces, patterns, lands, pads, etc.) on or at the first substrate side 110*a*. The example encapsulating material 160 additionally covers and surrounds the lateral sides 120*c* of the semiconductor die 120. The example encapsulating material 160 also covers and surrounds the lateral sides 140*c* and 150*c* of the dielectric layer 140 and plate 150, respectively. The example encapsulating material 160 additionally covers a peripheral portion of the second DL side 140*b* that is not covered by the semiconductor die 120. The example encapsulating material 160 comprises a first encapsulant side 160*a* (e.g., top encapsulant side, etc.) that is coplanar with the first plate side 150*a*.

In general, block 1040 may comprise encapsulating. Accordingly, the scope of this disclosure should not be limited by characteristics of any particular type of encapsulating material or of any particular manner of encapsulating.

The example method 1000 may, at block 1050, comprise singulating. Block 1050 may comprise singulating in any of a variety of manners, non-limiting examples of which are provided herein.

As discussed herein, the various method blocks (or operations or steps) discussed herein may be performed at the individual package level or may be performed at the wafer or panel level. In an example implementation in which blocks 1010-1040 are performed at the wafer or panel level, block 1050 may comprise singulating the packages into individual packages.

Block 1050 may, for example, comprise cutting the wafer or panel of a plurality of fingerprint sensor devices along singulation (or saw or cutting) streets between devices. Such cutting may, for example comprise laser cutting, mechanical saw cutting, plasma cutting, etc.

Figure 2E:
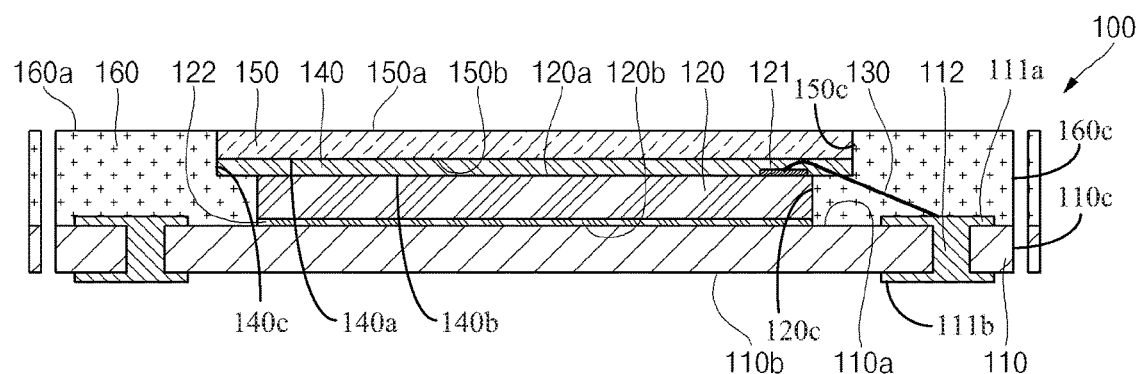

An example implementation 200E showing various aspects of block 1050 is shown at FIG. 2E. The example implementation 200E (or assembly, sub-assembly, package, etc.) shows an individual fingerprint sensor device 100 singulated from a panel or wafer of such devices. Note that although the example implementation 200E does not show additional interconnection structures (e.g., conductive bumps or balls, metal pillars or posts, etc.) on the conductive layers 111*b*, such structures may be formed before or after the singulating at block 1050. Along the singulation lines (or streets), the peripheral encapsulant sides 160*c* and the peripheral substrate sides 110*c* may, for example, be coplanar.

Note that the singulating may, for example, be performed after any of the example blocks of the example method 1000, for example followed by single-package processes.

In general, block 1050 may comprise singulating. Accordingly, the scope of this disclosure should not be limited by characteristics of any particular type or manner of singulating.

The example method 1000 may, at block 1095, comprise continuing the manufacturing (or processing), if necessary. Block 1095 may comprise continuing the manufacturing (or processing) in any of a variety of manners, non-limiting examples of which are provided herein.

For example, block 1095 may comprise performing additional substrate processing functions, mounting additional electronic components to the substrate, attaching device interconnection structures to the substrate, covering, general packaging, testing, marking, shipping, integrating the fingerprint sensing device 100 into another product, etc. Also for example, block 1095 may comprise directing execution flow of the example method 1000 to any previous block (or portion thereof) of the example method 1000. Additionally for example, block 1095 may comprise directing execution flow of the example method 1000 to any other method or portion thereof disclosed herein (e.g., the example methods associated with FIG. 3, the example methods associated with FIGS. 4A-4C, etc.).

In general, block 1095 may comprise continuing the manufacturing (or processing). Thus, the scope of this disclosure should not be limited by characteristics of any particular manner or type of continued manufacturing (or processing).

As shown in the example implementation 200E shown in FIG. 2E, which may also be referred to herein as the fingerprint sensor device 100 (or package), an example fingerprint sensor device manufactured in accordance with the example method 1000 of FIG. 1 may sense a fingerprint based on a change in the capacitance when the finger (or fingerprint thereof) is touching or in close proximity to the first plate side 150*a* (e.g., top plate side, etc.) of the plate 150, which is on the first die side 120*a* (e.g., top die side, etc.) of the semiconductor die 120, which includes the fingerprint sensing unit on the first die side. The fingerprint sensor device (or package) 100 may further include a flexible circuit board or other interconnection structure (not shown) electrically connected to the substrate 110 (e.g., to conductive layers 111*b* on the second substrate side 110*b* and/or to conductive layers 111*a* on the first substrate side 110*a*). The flexible circuit board may, for example, be electrically connected to one or more input and/or output pads of the fingerprint sensor package 100 and also may be electrically connected to an external substrate or an external electronic device.

Figure 3:
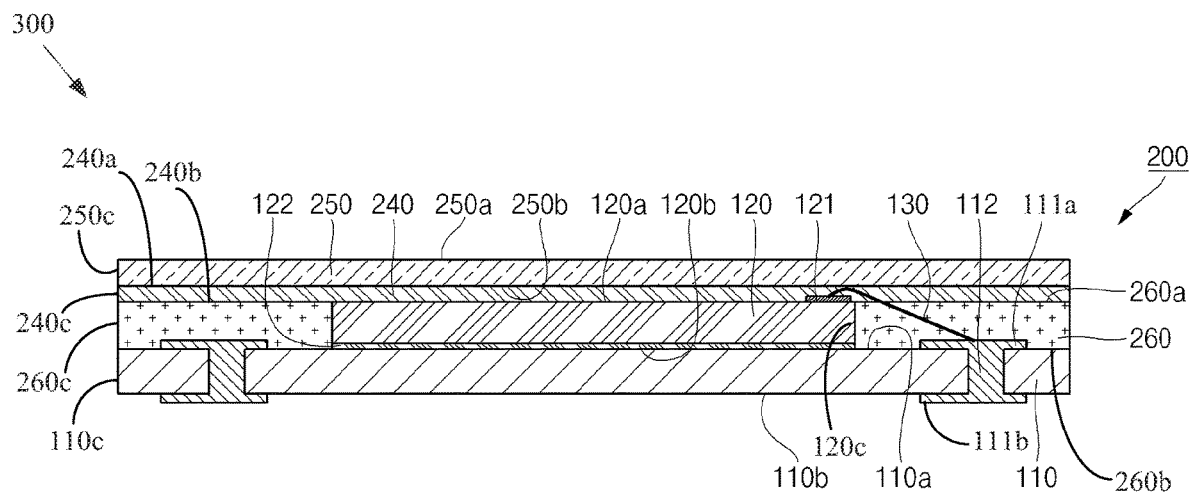
FIG. 3 shows a cross-sectional view illustrating an example sensor device and example methods of making a sensor device, in accordance with various aspects of the present disclosure.

As stated herein, the scope of the present disclosure is not limited to the specific example method steps (or associated structures) discussed. For example, various blocks (or portions thereof) may be removed from or added to the example method 1000 of FIG. 1, various blocks (or portions thereof) may be reordered, various blocks (or portions thereof) may be modified, etc. For example, as discussed herein, the size of the plate and/or dielectric layer may vary. In an example implementation, the size (or area) of the first plate side (e.g., top plate side, etc.) may be equal to (e.g., exactly equal to and/or equal to within manufacturing tolerance, etc.) the size (or area) of the first substrate side (e.g., top substrate side, etc.). FIG. 3 provides an example implementation.

In particular, FIG. 3 shows a cross-sectional view illustrating an example sensor device and example methods of making a sensor device, in accordance with various aspects of the present disclosure. The structures shown in FIG. 3 may share any or all characteristics with analogous structures shown in FIGS. 2A-2E, FIGS. 4A-4C, etc. FIG. 3 may, for example, illustrate an example sensor device (e.g., a fingerprint sensor device) at a stage (or block) of the example method 1000 of FIG. 1. FIGS. 1 and 3 will now be discussed together.

Figure 4A:
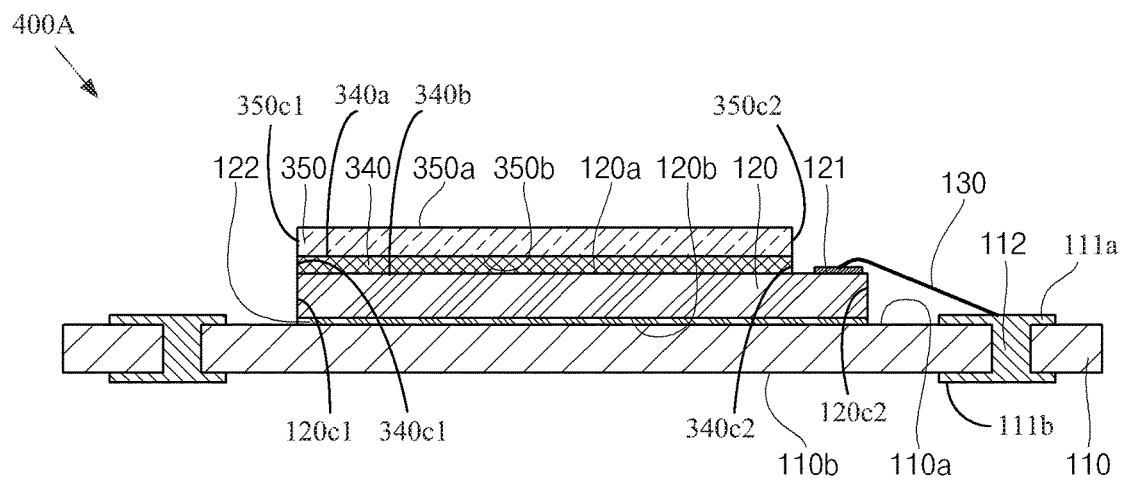
FIGS. 4A-4C show cross-sectional views illustrating example sensor devices and example methods of making sensor devices, in accordance with various aspects of the present disclosure.
Figure 4B:
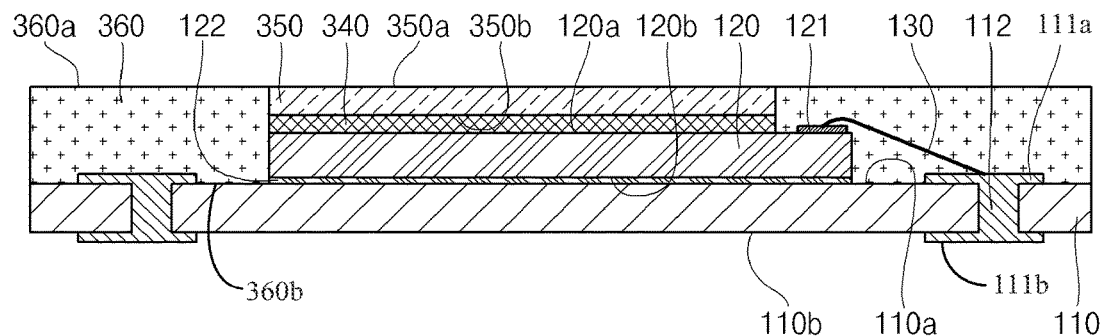
Figure 4C:
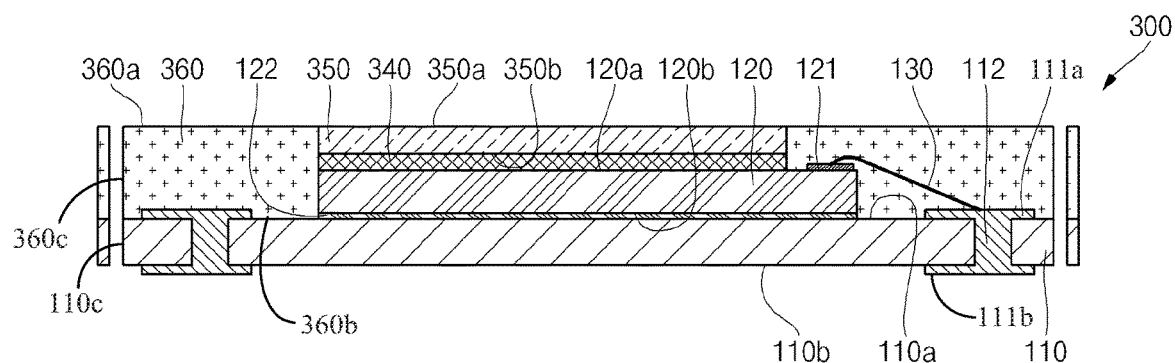

The example implementation 300, which may also be referred to herein as the fingerprint sensor device 200 (or package), comprises a dielectric layer 240, which may share any or all characteristics with the dielectric layer 140 of FIGS. 2C-2E, the dielectric layer 340 of FIGS. 4A-4C, etc. The example implementation 300 also comprises a plate 250, which may share any or all characteristics with the plate 150 of FIGS. 2C-2E, the plate 350 of FIGS. 4A-4C, etc. The example implementation 300 also comprises an encapsulating material 260, which may share any or all characteristics with the encapsulating material 160 of FIGS. 2D-2E, the encapsulating material 360 of FIGS. 4B-4C, etc.

The dielectric layer (DL) 240 has a first DL side 240a (e.g., a top DL side or surface, etc.), a second DL side 240b (e.g., a bottom DL side or surface, etc.), and peripheral DL sides 240c (e.g., lateral DL sides or surfaces, etc.) between the first and second DL sides. The plate 250 has a first plate side 250a (e.g., a top plate side or surface, etc.), a second plate side 250b (e.g., a bottom plate side or surface, etc.), and peripheral plate sides 250c (e.g., lateral plate sides or surface, etc.) between the first and second plate sides. The encapsulating material 260 has a first encapsulant side 260a (e.g., a top encapsulant side or surface, etc.), a second encapsulant side 260b (e.g., a bottom encapsulant side or surface, etc.), and peripheral encapsulant sides 260c (e.g., lateral encapsulant sides or surfaces, etc.) between the first and second encapsulant sides.

The second encapsulant side 260b is on the first substrate side 110a, and the encapsulating material 260 covers and surrounds the peripheral die sides 120c. The first encapsulant side 260a is coplanar with the first die side 120a. The second DL side 240b covers the first encapsulant side 260a and the first die side 120a. The second plate side 250b covers the first DL side 240a. Additionally, in the example implementation 300, the peripheral substrate sides 110c, peripheral encapsulant sides 260c, peripheral DL sides 240c, and peripheral plate sides 250c are coplanar.

Referring to the example method 1000, after the dielectric layer and plate are attached at block 1030 and the dielectric layer is cured (and hardened), execution of the example method 1000 flows to block 1040. At block 1040, the encapsulating material is formed in empty regions of the assembly. The individual fingerprint sensor devices are then singulated from the panel or wafer, resulting in the example fingerprint sensor device 200.

As stated herein, the scope of the present disclosure is not limited to the specific example method steps (or associated structures) discussed. For example, various blocks (or portions thereof) may be removed from or added to the example method 1000 of FIG. 1, various blocks (or portions thereof) may be reordered, various blocks (or portions thereof may be modified), etc. For example, as discussed herein, the size of the plate and/or dielectric layer may vary. In an example implementation, the size (or area) of the first plate side (e.g., top plate side or surface, etc.) may be less than the size (or area) of the first die side (e.g., top die side or surface, etc.). FIGS. 4A-4C provide example implementations.

In particular, FIGS. 4A-4C show cross-sectional views illustrating example sensor devices and example methods of making sensor devices, in accordance with various aspects of the present disclosure. The structures shown in FIGS. 4A-4C may share any or all characteristics with analogous structures shown in FIGS. 2A-2E, FIG. 3, etc. FIGS. 4A-4C may, for example, illustrate an example sensor device (e.g., a fingerprint sensor device) at various stages (or blocks) of the example method 1000 of FIG. 1. FIGS. 1 and 4A-4C will now be discussed together.

The example implementations 400A-400C, which may also be referred to herein as the fingerprint sensor device 300 (or package), comprises a dielectric layer 340, which may share any or all characteristics with the dielectric layer 140 of FIGS. 2C-2E, the dielectric layer 240 of FIG. 3, etc. The example implementations 400A-400C also comprise a plate 350, which may share any or all characteristics with the plate 150 of FIGS. 2C-2E, the plate 250 of FIG. 3, etc. The example implementations 400B-400C additionally comprise an encapsulating material 360, which may share any or all characteristics with the encapsulating material 160 of FIGS. 2D-2E, the encapsulating material 260 of FIG. 3, etc.

Referring to block 1030 of FIG. 1 and the example implementation 400A of FIG. 4A, the size (or area) of the first plate side 350a (e.g., top plate side or surface, etc.), which may also match the size of the dielectric layer 340, may be less than the size (or area) of the first die side 120a (e.g., top die side or surface, etc.). The example interconnection pad 121 on the first die side 120a is not covered by the dielectric layer 340 and plate 350. For example, the peripheral die side 120c2 is positioned laterally outward from the peripheral DL side 340c and the peripheral plate side 350c (which may be coplanar with each other). Note, however, that in another example implementation either of the dielectric layer 340 or the plate 350 may cover the interconnection pad 121. Also, though at least one (or two, or three) of the peripheral die sides 120c1 is shown coplanar with a respective peripheral DL side 340c1 and with a respective peripheral plate side 350c1, this need not be the case.

Referring to block 1040 of FIG. 1 and the example implementation 400B of FIG. 4B, the first encapsulant side 360a (e.g., top encapsulant side or surface, etc.) is coplanar with the first plate side 350a (e.g., top plate side or surface, etc.). The second encapsulant side 360b (e.g., bottom encapsulant side or surface, etc.) covers the first substrate side 110a and the conductive layer 111a thereon. The encapsulating material 360 also covers and surrounds the peripheral side surfaces of the adhesive layer 122, semiconductor die 120, dielectric layer 340, and plate 350. The encapsulating material 360 additionally covers the interconnection pad 121 and surrounds (or covers or contacts) the bond wire 130 (e.g., all surfaces of the bond wire 130 between the interconnection pad 121 and the conductive layer 111a). The encapsulating material 360 also covers an end portion of the first die side 120a (e.g., top die side, etc.) on which the interconnection pad 121 is positioned. Note that although only one end of the first die side 120a is shown covered by the encapsulating material 360, any or all ends of the first die side 120a may be covered by the encapsulant in this manner (e.g., one end, two ends, four ends, three ends, etc.) and may have interconnection structures 121 positioned thereon.

Referring to block 1050 of FIG. 1, the example implementation 400C (or assembly, sub-assembly, package, etc.) shows an individual fingerprint sensor device 300 singulated from a panel or wafer of such devices. Note that although the example implementation 400C does not show additional interconnection structures (e.g., conductive bumps or balls, metal pillars or posts, etc.) on the conductive layers 111*b*, such structures may be formed before or after the singulating at block 1050. Along the singulation lines (or streets), the peripheral encapsulant sides 360*c* and the peripheral substrate sides 110*c* may, for example, be coplanar.

The discussion herein included numerous illustrative figures that showed various portions of an electronic device (e.g., a fingerprint sensor device) and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a fingerprint sensor device and a method of making a fingerprint sensor device. As non-limiting examples, various aspects of this disclosure provide various fingerprint sensor devices, and methods of manufacturing thereof, that comprise an interconnection structure, for example a bond wire, at least a portion of which extends into a dielectric layer utilized to mount a plate, and/or that comprise an interconnection structure that extends upward from the semiconductor die at a location that is laterally offset from the plate. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A sensor device comprising:
    a substrate having a top substrate side, a bottom substrate side, and lateral substrate sides between the top and bottom substrate sides, the substrate comprising a conductive layer on the top substrate side;
    a semiconductor die having a top die side, a bottom die side coupled to the top substrate side, and lateral die sides between the top and bottom die sides, the semiconductor die comprising a sensing area on the top die side and a conductive pad on the top die side;
    a conductive interconnection structure electrically connecting the conductive pad of the semiconductor die to the conductive layer of the substrate;
    a dielectric layer (DL) having a top DL side, a bottom DL side coupled to the top die side, and lateral DL sides between the top and bottom DL sides;
    a plate positioned over the sensing area of the semiconductor die and over the conductive pad of the semiconductor die, the plate having a top plate side, a bottom plate side coupled to the top DL side, and lateral plate sides between the top and bottom plate sides; and
    an encapsulating material that covers the top substrate side and the lateral die sides.

2. The sensor device of claim 1, wherein in a cross-section view, the plate vertically covers an entirety of the top die side.

3. The sensor device of claim 2, wherein the plate vertically covers a first portion of the encapsulating material.

4. The sensor device of claim 3, wherein the plate does not vertically cover a second portion of the encapsulating material.

5. The sensor device of claim 1, wherein:
    the conductive interconnection structure comprises a bond wire; and
    the bond wire comprises a first portion that is vertically covered by the plate, and a second portion that is not vertically covered by the plate.

6. The sensor device of claim 1, wherein the encapsulating material contacts and laterally surrounds the plate.

7. The sensor device of claim 6, wherein the encapsulating material comprises a top surface that is substantially coplanar with the top plate side.

8. The sensor device of claim 1, wherein the dielectric layer comprises an adhesive layer that vertically covers a perimeter section of the top die side.

9. A sensor device comprising:
    a substrate having a top substrate side, a bottom substrate side, and lateral substrate sides between the top and bottom substrate sides, the substrate comprising a conductive layer on the top substrate side;
    a semiconductor die having a top die side, a bottom die side coupled to the top substrate side, and lateral die sides between the top and bottom die sides, the semiconductor die comprising a sensing area on the top die side and a conductive pad on the top die side;
    a conductive interconnection structure electrically connecting the conductive pad of the semiconductor die to the conductive layer of the substrate;
    a dielectric layer (DL) having a top DL side, a bottom DL side coupled to the top die side, and lateral DL sides between the top and bottom DL sides, where a first portion of the conductive interconnection structure is embedded in the dielectric layer;
    a plate positioned over the semiconductor die, the plate having a top plate side, a bottom plate side coupled to the top DL side, and lateral plate sides between the top and bottom plate sides; and
    an encapsulating material that covers the top substrate side and the lateral die sides.

10. The sensor device of claim 9, wherein a second portion of the conductive interconnection structure is embedded in the encapsulating material.

11. The sensor device of claim 9, wherein the conductive interconnection structure comprises a bond wire that protrudes from the bottom DL side.

12. The sensor device of claim 9, wherein the dielectric layer comprises an adhesive layer that vertically covers a perimeter section of the top die side.

13. The sensor device of claim 12, wherein the adhesive layer vertically covers an entirety of the top die side.

14. The sensor device of claim 12, wherein the adhesive layer vertically covers a portion of the encapsulating material outside a footprint of the semiconductor die.

15. The sensor device of claim 9, wherein the encapsulating material comprises a top surface that is vertically higher than the top DL side, and a bottom side that is vertically lower than the bottom die side.

16. The sensor device of claim 9, wherein the encapsulating material comprises an uppermost surface that is substantially coplanar with the top plate side.

17. A method of manufacturing a sensor device, the method comprising:
    providing a first structure comprising:
        a substrate having a top substrate side, a bottom substrate side, and lateral substrate sides between the top and bottom substrate sides, the substrate comprising a conductive layer on the top substrate side;

a semiconductor die having a top die side, a bottom die side coupled to the top substrate side, and lateral die sides between the top and bottom die sides, the semiconductor die comprising a sensing area on the top die side and a conductive pad on the top die side; and a conductive interconnection structure electrically connecting the conductive pad of the semiconductor die to the conductive layer of the substrate;

forming a dielectric layer (DL) having a top DL side, a bottom DL side coupled to the top die side, and lateral DL sides between the top and bottom DL sides;

forming a plate positioned over the sensing area of the semiconductor die and over the conductive pad of the semiconductor die, the plate having a top plate side, a bottom plate side coupled to the top DL side, and lateral plate sides between the top and bottom plate sides; and forming an encapsulating material that covers the top substrate side and the lateral die sides.

18. The method of claim 17, wherein in a cross-section view:

the plate vertically covers an entirety of the top die side;

the plate vertically covers a first portion of the encapsulating material; and the plate does not vertically cover a second portion of the encapsulating material.

19. The method of claim 17, wherein a first portion of the conductive interconnection structure comprises a bond wire comprising a first bond wire portion embedded in the dielectric layer.

20. The method of claim 19, wherein the bond wire comprises a second bond wire portion embedded in the encapsulating material.

* * * * *